United States Patent
Nystrom et al.

(10) Patent No.: US 7,002,427 B2
(45) Date of Patent: *Feb. 21, 2006

(54) FILTER TRIMMING (75) Inventors: Christian Nystrom, Sollentuna (SE); Per Konradsson, Jarfalla (SE); Ari Grasbeck, Solna (SE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/769,976

(22) Filed: Feb. 2, 2004

(65) Prior Publication Data

US 2004/0212447 A1 Oct. 28, 2004

Related U.S. Application Data (63) Continuation of application No. 10/093,683, filed on Mar. 8, 2002, now Pat. No. 6,686,809.

(30) Foreign Application Priority Data

Mar. 9, 2001 (SE) .................................. 0100805

(51) Int. Cl.
*H03G 11/04* (2006.01)
*H04B 3/04* (2006.01)

(52) U.S. Cl. ...................... 333/17.1; 333/18; 333/174; 327/553; 327/554; 327/558; 455/340

(58) Field of Classification Search ............... 333/17.1, 333/17.2, 18, 174; 327/553, 554, 558; 455/340

See application file for complete search history.

(56) References Cited

U.S. PATENT DOCUMENTS

| | | | |
|---|---|---|---|
| 3,969,678 A | 7/1976 | Asahara et al. | 327/557 |
| 4,528,698 A | 7/1985 | Fraser | 455/319 |
| 5,179,727 A | 1/1993 | Imagawa | 455/182.3 |
| 5,245,646 A | 9/1993 | Jackson et al. | 377/2 |
| 5,420,552 A * | 5/1995 | Sakka | 333/17.1 |
| 5,942,935 A * | 8/1999 | Okanobu | 327/553 |
| 6,014,554 A | 1/2000 | Smith | 455/340 |
| 6,114,902 A | 9/2000 | Beatson et al. | 327/553 |
| 6,169,446 B1 | 1/2001 | Ramet et al. | 327/554 |
| 6,686,809 B1 * | 2/2004 | Nystrom et al. | 333/17.1 |

* cited by examiner

*Primary Examiner*—Barbara Summons (57) ABSTRACT

An adjustable phase shifter generates a phase shifted reference signal by introducing a phase shift in a reference signal. A phase detector identifies a phase difference between the reference signal and the phase shifted reference signal. A control signal generator generates a plurality of control signals, each of which causes the adjustable phase shifter to adjust a magnitude of at least one component value in the adjustable phase shifter. The phase shift introduced by the adjustable phase shifter is based at least partially on the magnitude of the at least one component value in the adjustable phase shifter. The control signal generator also selects one of the control signals, where the selected control signal causes the adjustable phase shifter to produce the phase shifted reference signal such that the phase difference attains a specified value. The analog filter adjusts a magnitude of at least one component value in the analog filter based at least partially on the selected control signal.

20 Claims, 4 Drawing Sheets

FILTER TRIMMING

This application is a continuation of prior U.S. patent application Ser. No. 10/093,683 filed on Mar. 8, 2002, now U.S. Pat. No. 6,686,809.

THE BACKGROUND OF THE INVENTION AND PRIOR ART

The present invention relates generally to trimming of analogue filters in integrated circuits. More particularly the invention relates to a method for automatically altering a magnitude of at least one component value in an analogue filter and an automatic adjusting circuit for calibrating an analogue filter in an integrated circuit. The invention also relates to a computer program.

The manufacturing process for integrated circuits generally causes a degree of uncertainty, with respect to the component values of specific component types. Integrated passive components, such as capacitors and resistors demonstrate undesirable variations in component values, so-called process variations. The value of an actual RC-product in a filter may deviate as much as 30–40% from a nominal value as a consequence of the process variations. Various attempts have already been made to compensate for these detrimental effects.

For instance, the patent document JP, 11274895 discloses a signal processing circuit that is capable of making up for variations of integrated resistors and capacitors by means of adjustable digital filters. A filter coefficient switching means sets the filter coefficient values in a set of digital filters from a predefined coefficient table. The filter coefficient switching means chooses such coefficient values that any variation in a signal processing circuit being due to the variation of a semiconductor manufacturing process is compensated for.

The U.S. Pat. No. 5,179,727 describes an automatic adjusting circuit for an analogue filter on a semiconductor chip. The adjusting circuit controls the filter's parameters such that its centre frequency becomes equal to a reference frequency. The automatic adjusting circuit includes a first phase detector and calibrating filter for coarse frequency tuning and a second phase detector and calibrating filter for fine frequency tuning. The first phase detector produces a signal based on a phase difference between the reference signal and the reference signal, filtered through the first calibrating filter, having a low selectivity, and, the second phase detector produces a signal based on a phase difference between the reference signal and the reference signal filtered through the second calibrating filter, having a high selectivity. A composite signal is then formed by combining the output signals from both the phase detectors. A DC component of the composite signal is, on one hand, fed back as a control signal to the calibrating filters. On, the other hand, the DC component controls the centre frequency of the analogue filter to be controlled to a predetermined ratio with respect to the reference frequency signal by automatically adjusting the centre frequency of the calibrating filters to be equal to the reference frequency signal.

The solution according to the former reference involves digital filtering in series with the analogue filter. Digital filters, however, always cause power losses and introduce a degree of distortion into the signal path. Digital filters are therefore undesired if they can be avoided.

The latter reference, conversely, tunes itself by an analogue manner to a desired centre frequency. This is, of course, a flexible solution that allows a designer to utilise one and the same filter for a multitude of applications in which different filtering characteristics may be demanded. However, the solution involves active filters that per se are relatively noisy and non-linear. This in turn causes distortion and deteriorates the filter 4 performance, which of course, is adverse.

Consequently, the prior art presents various means to either directly compensate for process variations of integrated component values or to alter an analogue filter's filtering characteristics and thus indirectly compensate for any process variations. However, the proposed solutions are associated with various unwanted side effects, such as power loss, distortion, noise or combinations thereof.

SUMMARY OF THE INVENTION

It is therefore an object of the present invention to alleviate the problems above and thus provide an improved solution for handling process variations of integrated component values.

According to one aspect of the invention the object is achieved by a method for automatically altering a magnitude of at least one component value in an analogue filter as initially described, which is characterised by the integrated circuit comprising an adjustable phase shifter for receiving a periodic reference signal. Based on this reference signal the adjustable phase shifter produces a periodic phase shifted signal. The method involves adjusting a magnitude of at least one component value in the adjustable phase shifter in response to a control signal, such that the phase shift between the periodic reference-signal and the periodic phase shifted signal attains a calibrated value, which is as close as possible to a desired value, for instance 90°. The control signal is in turn generated on basis of a test signal that is produced by a phase detector, which receives the periodic reference signal and the phase shifted periodic reference signal. The method finally involves setting at least one component value in the analogue filter in accordance with a setting of the at least one component value in the adjustable phase shifter, which produces the calibrated value.

According to another aspect of the invention these objects are achieved by a computer program directly loadable into the internal memory of a digital computer, comprising software for controlling the method described in the above paragraph when said program is run on a computer, for instance, a digital signal processor (DSP).

According to yet another aspect of the invention these objects are achieved by a computer readable medium, having a program recorded thereon, where the program is to make a computer, such as a DSP, perform the method described in the penultimate paragraph above.

According to an additional aspect of the invention the object is achieved by an automatic adjusting circuit for calibrating an analogue filter in an integrated circuit. The automatic adjusting circuit includes an adjustable phase shifter that receives a periodic reference signal, and on basis thereof, produces a periodic phase shifted signal. The automatic adjusting circuit also includes a phase detector for receiving the periodic reference signal and the phase shifted periodic signal, and producing a test signal in response to a phase difference between the periodic reference signal and the periodic phase shifted signal. Moreover, the automatic adjusting circuit includes means for producing a control signal on basis of the test signal. The control signal influences a magnitude of at least one component value in the adjustable phase shifter and it is allocated such value that the phase shift between the periodic reference signal and the periodic phase shifted signal attains a calibrated value being as close as possible to a desired value. Finally, the automatic adjusting circuit comprises means for setting the at least one component value in the adjustable filter in accordance with a setting of the at least one component value in the adjustable phase shifter, which produces the calibrated value.

The invention thereby provides an efficient solution, which makes it possible to handle unavoidable process variations of integrated component values.

The invention also offers a competent possibility for continuous compensation for any variations in component values due to temperature variations.

Moreover, the proposed solution includes standardised and relatively uncomplicated building blocks. The invention therefore constitutes an attractive alternative also from a cost and a robustness point-of-view.

BRIEF DESCRIPTION OF THE DRAWINGS

The present invention is now to be explained more closely by means of preferred embodiments, which are disclosed as examples, and with reference to the attached drawings.

DESCRIPTION OF PREFERRED
EMBODIMENTS OF THE INVENTION

As mentioned initially, the value of an actual RC-product in an integrated filter may deviate up to ±40% from a corresponding nominal value due to variations in the semiconductor manufacturing process. Obviously, deviations of such magnitude cannot be tolerated, since they result in very unpredictable filter characteristics. Furthermore, the value of the RC-product may deviate over time in consequence of temperature variations and thus require a continuous or repeated compensation.

Figure 1:
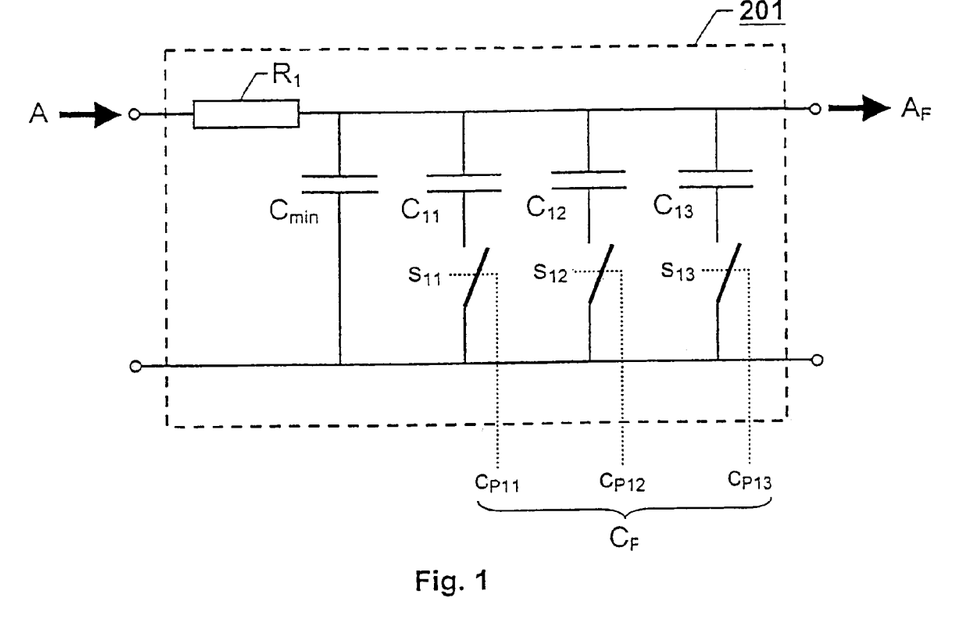
FIG. 1 shows a circuit diagram over an analogue filter according to a first embodiment of the invention.

FIG. 1 shows a circuit-diagram over an analogue lowpass filter 201, according to an embodiment of the invention. Having the process variations in mind, the filter 201 is prepared in advance with a set of controllable switches $s_{11}$, $s_{12}$ and $s_{13}$, which each controls a particular capacitor $C_{11}$, $C_{12}$ and $C_{13}$ respectively, such that any combination of individual capacitors $C_{11}$–$C_{13}$ may be included electrically in the filter circuit in addition to a minimum capacitance $C_{min}$. According to a preferred embodiment of the invention, each of the switchable capacitors has a different component value, for instance, $C_{11}=1,0C$, $C_{12}=2,0C$ and $C_{13}=4,0C$. Depending on how the controllable switches $s_{11}$, $s_{12}$ and $s_{13}$ are set, the total nominal capacitance value can thus be varied from $C_{min}$ to $C_{min}+7,0C$. The actual capacitance value may, of course, deviate from the nominal capacitance value due to the process variations. However, the controllable switches $s_{11}$–$s_{13}$ provide a considerable degree of freedom to vary also the actual capacitance value. Especially, the actual capacitance value is expected to be adjustable to a value that is sufficiently close to the nominal capacitance value. Even if also the component of one or more resistors $R_1$ included in the filter 201 deviate from corresponding nominal values, the controllable switches $s_{11}$–$s_{13}$ make it possible to adjust the RC product to an acceptable value.

By assigning an adequate set of signal elements $c_{P11}$–$c_{P13}$ in a control signal $C_P$, the controllable switches $s_{11}$–$s_{13}$ can allocate a value to the RC product ($R_1 \times (s_{11}C_{11}+s_{12}C_{12}+s_{13}C_{13}+C_{min})$, where $s_i=1 \leftrightarrow$ closed switch and $s_i=0 \leftrightarrow$ open switch) which is sufficiently close to a desired nominal value. Consequently, an analogue input signal A fed through the lowpass filter 201 will produce an analogue output signal $A_F$ in accordance with the filter design.

Nevertheless, it is not trivial to find the set of signal elements $c_{P11}$–$c_{P13}$ in the control signal $C_P$ that generates the desired RC product value. Therefore, an automatic adjusting circuit is attached to the analogue filter 201. According to a preferred embodiment of the invention, the automatic adjusting circuit and the analogue filter 201 are integrated onto one and the same circuit chip, such that they are both exposed to the same process variation. However, any other circuits, units or components involved may be located either on the same or on a different circuit chip.

Figure 2:
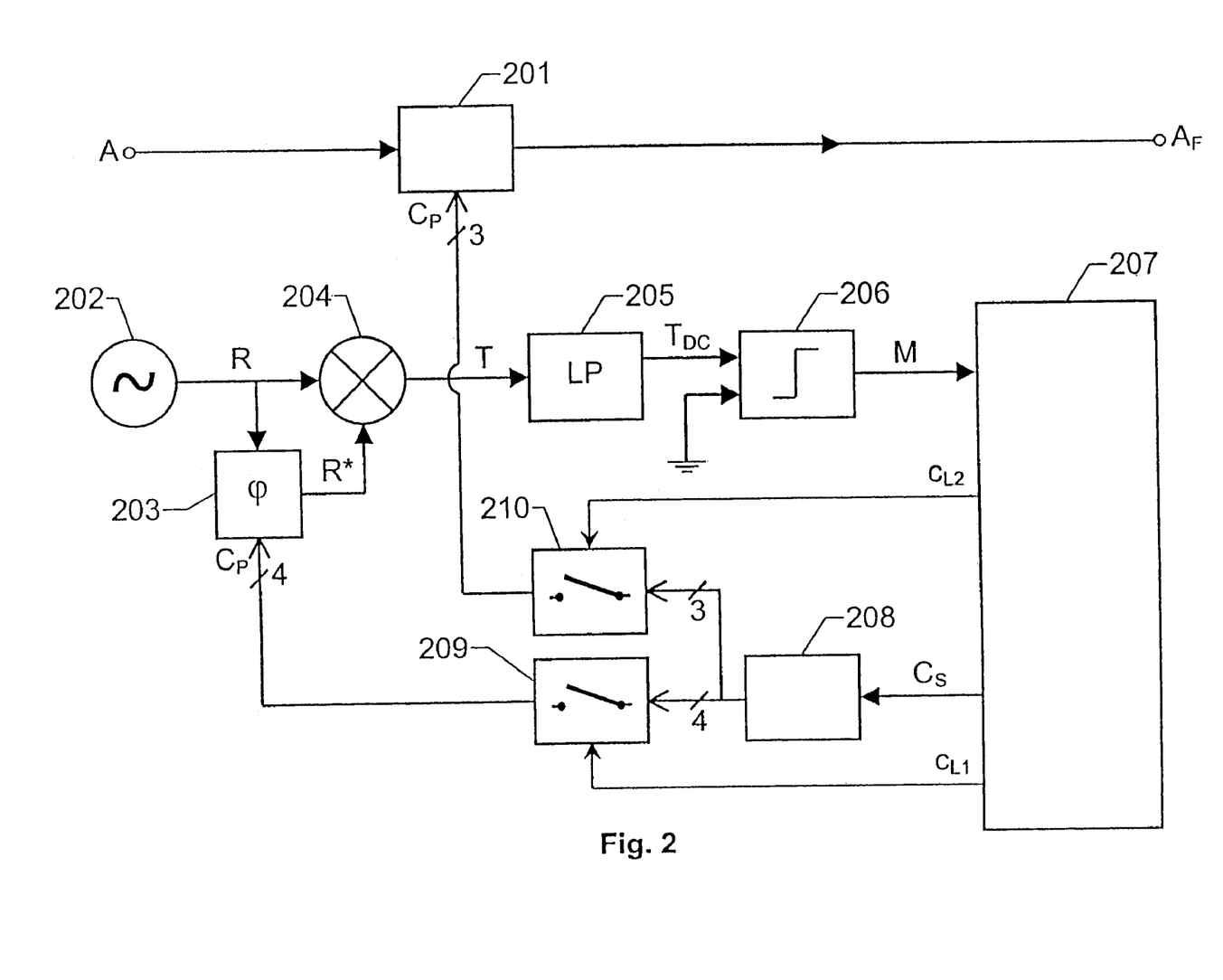
FIG. 2 shows a block diagram over an automatic adjusting circuit for calibrating an analogue filter according to a first embodiment of the invention.

FIG. 2 shows a block diagram over an automatic adjusting circuit for calibrating the analogue filter 201 by means of the control signal $C_P$ according to an embodiment of the invention. A local oscillator 202 produces a periodic reference signal R of a particular frequency. The periodic reference signal R is fed both to a phase detector 204 and to an adjustable phase shifter 203, whose phase shift with respect to the input signal depends on the value of the control signal $C_P$. The adjustable phase shifter 203 produces a periodic phase shifted signal R* based on the periodic reference signal R. The phase detector 204 receives both the periodic reference signal R and the phase shifted periodic signal R*. The phase detector 204 generates a test signal T in response to a phase difference between the periodic reference signal R and the periodic phase shifted signal R*.

Provided that an optimal (or desired) setting of the adjustable phase shifter 203 corresponds to a phase shift between the periodic reference signal R and the phase shifted periodic signal R* equal to one quarter of a full period of the periodic reference signal R (i.e. 90° or $\pi/2$ radians), the phase detector 204 can be made of a multiplier. A zero valued test signal T thus indicates an ideal setting of the adjustable phase shifter 203 and consequently also an optimal control signal $C_P$. In principal, any phase shift between the periodic reference signal R and the phase shifted periodic signal R* can be regarded as an ideal value. However, it is preferable to choose a local oscillator 202 that produces a periodic reference signal R of such frequency relative the nominal component values, that an ideal setting of the adjustable phase shifter 203 implies a 90° phase difference between the periodic reference signal R and the phase shifted periodic signal R*. The phase detector 204 may then namely be a comparatively simple element, such as a multiplier.

A lowpass filter 205 receives the test signal T and produces in response thereto a level signal $T_{DC}$, which represents a direct voltage component of the test signal T. Minor deviations from an otherwise stable value (which ideally is zero) of the test signal T are thereby eliminated. Any other integrating elements besides a lowpass filter may, of course, be utilised in alternative embodiments of the invention. For instance, a purely capacitive element of suitable magnitude may constitute the lowpass filter 205.

A comparator 206 receives the level signal $T_{DC}$ and produces an observation signal M on basis of the level signal. $T_{DC}$ relative a reference level, which for instance represents a zero voltage. The observation signal M is fed to a digital signal processor 207 for evaluation. The reference level received by the comparator 206 is chosen relative the ideal setting of the adjustable phase shifter 203 and the phase detector 204, such that the smaller the absolute value of the observation signal M the better the adjustable phase shifter setting (and thus also the control signal $C_P$ value). The digital signal processor 207 registers and stores any incoming observation signal M in an internal buffer memory.

Figure 3:
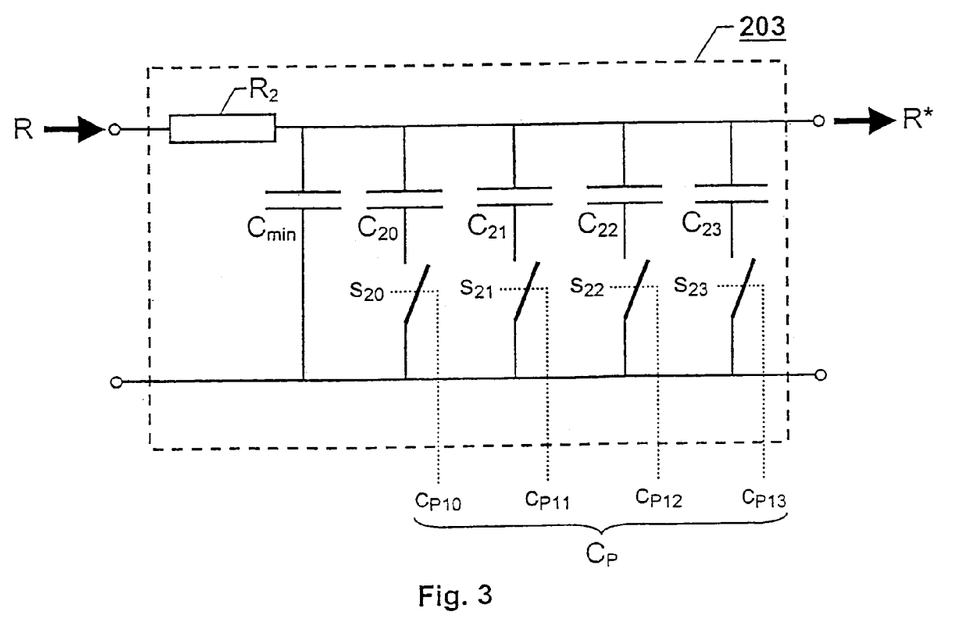
FIG. 3 shows a circuit diagram over an adjustable phase shifter according to the first embodiment of the invention.

FIG. 3 shows a circuit diagram over an adjustable phase shifter according to the first embodiment of the invention. As can be seen in the figure, the adjustable phase shifter 203, in similarity with the analogue lowpass filter 201, contains a set of controllable switches $s_{20}$, $s_{21}$, $s_{22}$ and $s_{23}$, which each controls a particular capacitor $C_{20}$, $C_{21}$, $C_{22}$ and $C_{23}$ respectively, such that any combination of individual capacitors $C_{20}$–$C_{23}$ may be included electrically in a filter circuit in addition to the minimum capacitance $C_{min}$. The state of each controllable switch $s_{20}$–$s_{23}$ is in turn determined by the value of the signal elements $c_{P10}$–$c_{P13}$ in the control signal $C_P$.

Depending on the number of controllable switches' $s_{20}$, $s_{21}$, $s_{22}$ and $s_{23}$ in the adjustable phase shifter 203, the signal elements $c_{P10}$–$c_{P13}$ may be arranged according to a particular number of different combinations. The control signal $C_P$ may thus attain the same number of different values. For instance, four controllable switches $s_{20}$–$s_{23}$ result in $2^4=16$ different values 0000–1111 of the control signal $C_P$. Given the nominal relationship in capacitance values $C_{20}=0{,}5C$, $C_{21}=1{,}0C$, $C_{22}=2{,}0C$, $C_{23}=4{,}0C$, the control signal $C_P$ determines the nominal RC-product value according to table 1 below.

TABLE 1

| CP | | | | RC-product($R_2 \times C_{tot}$) |
|---|---|---|---|---|
| $C_{P13}$ | $C_{P12}$ | $C_{P11}$ | $C_{P10}$ | [$\Omega$F] |
| 0 | 0 | 0 | 0 | $R_2 C_{min}$ |
| 0 | 0 | 0 | 1 | $R_2(C_{min} + 0.5)$ |
| 0 | 0 | 1 | 0 | $R_2(C_{min} + 1.0)$ |
| 0 | 0 | 1 | 1 | $R_2(C_{min} + 1.5)$ |
| 0 | 1 | 0 | 0 | $R_2(C_{min} + 2.0)$ |
| 0 | 1 | 0 | 1 | $R_2(C_{min} + 2.5)$ |
| 0 | 1 | 1 | 0 | $R_2(C_{min} + 3.0)$ |
| 0 | 1 | 1 | 1 | $R_2(C_{min} + 3.5)$ |
| 1 | 0 | 0 | 0 | $R_2(C_{min} + 4.0)$ |
| 1 | 0 | 0 | 1 | $R_2(C_{min} + 4.5)$ |
| 1 | 0 | 1 | 0 | $R_2(C_{min} + 5.0)$ |
| 1 | 0 | 1 | 1 | $R_2(C_{min} + 5.5)$ |
| 1 | 1 | 0 | 0 | $R_2(C_{min} + 6.0)$ |
| 1 | 1 | 0 | 1 | $R_2(C_{min} + 6.5)$ |
| 1 | 1 | 1 | 0 | $R_2(C_{min} + 7.0)$ |
| 1 | 1 | 1 | 1 | $R_2(C_{min} + 7.5)$ |

Either the digital signal processor 207 systematically steps through the 16 control signal values $C_P$ from 0000 to 1111 and stores a corresponding observation signal value M, or the digital signal processor 207 allocates values to the control signal $C_P$ according to an alternative sequence, via which an optimal control signal $C_P$ can be determined without necessarily stepping through all the 16 steps.

A first latch 209, being controlled by means of a first command signal $C_{L1}$ from the digital signal processor 207, is closed when a the control signal $C_P$ value has been updated, such that the control signal $C_P$ value can be fed to the adjustable phase shifter 203 and the digital signal processor 207 can register a new observation signal value M. The digital signal processor 207 delivers a primary control signal value $C_S$, on a serial format, corresponding to a control signal value $C_P$ to a serial-to-parallel converter 208. The serial-to-parallel converter 208 then produces the control signal $C_P$, having a parallel signal format, based on the primary control signal $C_S$.

According to an alternative embodiment of the invention, the digital signal processor 207 delivers the control signal value $C_P$ directly on a parallel format being adapted to the analogue filter 201 and the adjustable phase shifter 203.

According to other alternative embodiments of the invention, one or both of the units 206 and 208 are realised by functions within the digital signal processor 207. The digital signal processor 207 generates a control signal. $C_P$, in response to the observation signal M based on the following conditions.

According to other alternative embodiments of the invention, the comparator 206 is replaced by an A/D-converter that, as an alternative to the observation signal M, delivers a digitised level signal $T_{DC}$ to the digital signal processor 207 for evaluation.

The digital signal processor 207 thus derives an optimal control signal value $C_P$ that results in the smallest absolute value of the observation signal M. The digital signal processor 207 feeds a primary control signal value $C_S$ representing the optimal control signal value $C_P$ to a serial-to-parallel converter 208. The serial-to-parallel converter 208 produces a corresponding control signal $C_P$ on basis of the primary control signal $C_S$. A second latch 210 being controlled by means of a second command signal $c_{L2}$ from the digital signal processor 207, is closed such that the control signal $C_P$ is forwarded to the analogue filter-203 whose controllable switches $s_{11}$–$s_{13}$ are set in accordance with the optimal control signal value $C_P$.

Provided that the process variation of the components in the analogue lowpass filter 201 is substantially the same (with respect to component type and magnitude) as the process variation of the components in the adjustable phase shifter 203, the setting of the controllable switches $s_{11}$–$s_{13}$ that accords with the optimal control signal value $C_P$ is expected to bring about a desired filtering of the analogue input signal A into the analogue output signal $A_F$, irrespective of any process variation when manufacturing the semiconductor chip onto which the circuitry is integrated.

According to a preferred embodiment of the invention, the adjustable phase shifter 203 includes a controllable switch $s_{20}$ respective capacitor $C_{20}$, in addition to the total number of controllable switches $s_{11}$–$s_{13}$ in the analogue filter 201. This improves the possibility to achieve an optimal control signal value $C_P$. The closing of a controllable switch $s_{21}$ for a capacitor $C_{21}$, corresponding to a smallest capacitance value $C_{11}=1{,}0C$ in the analogue filter 201, may namely cause a somewhat too large phase shift while the opening of the same switch $s_{21}$ may cause a somewhat too small phase shift. It is generally difficult for the digital signal processor 207 to determine whether a closed or opened switch $s_{21}$ provides the best result. However, the extra controllable switch $s_{20}$ and capacitor $C_{20}$ (preferably having a nominal capacitance value $C_{20}=0{,}5C$, i.e. half the magnitude of the smallest capacitance value $C_{11}$, $=1{,}0C$ in the analogue filter 201) make it possible to resolve determining which position of the switch, $s_{21}$ that provides the best result.

Figure 4:
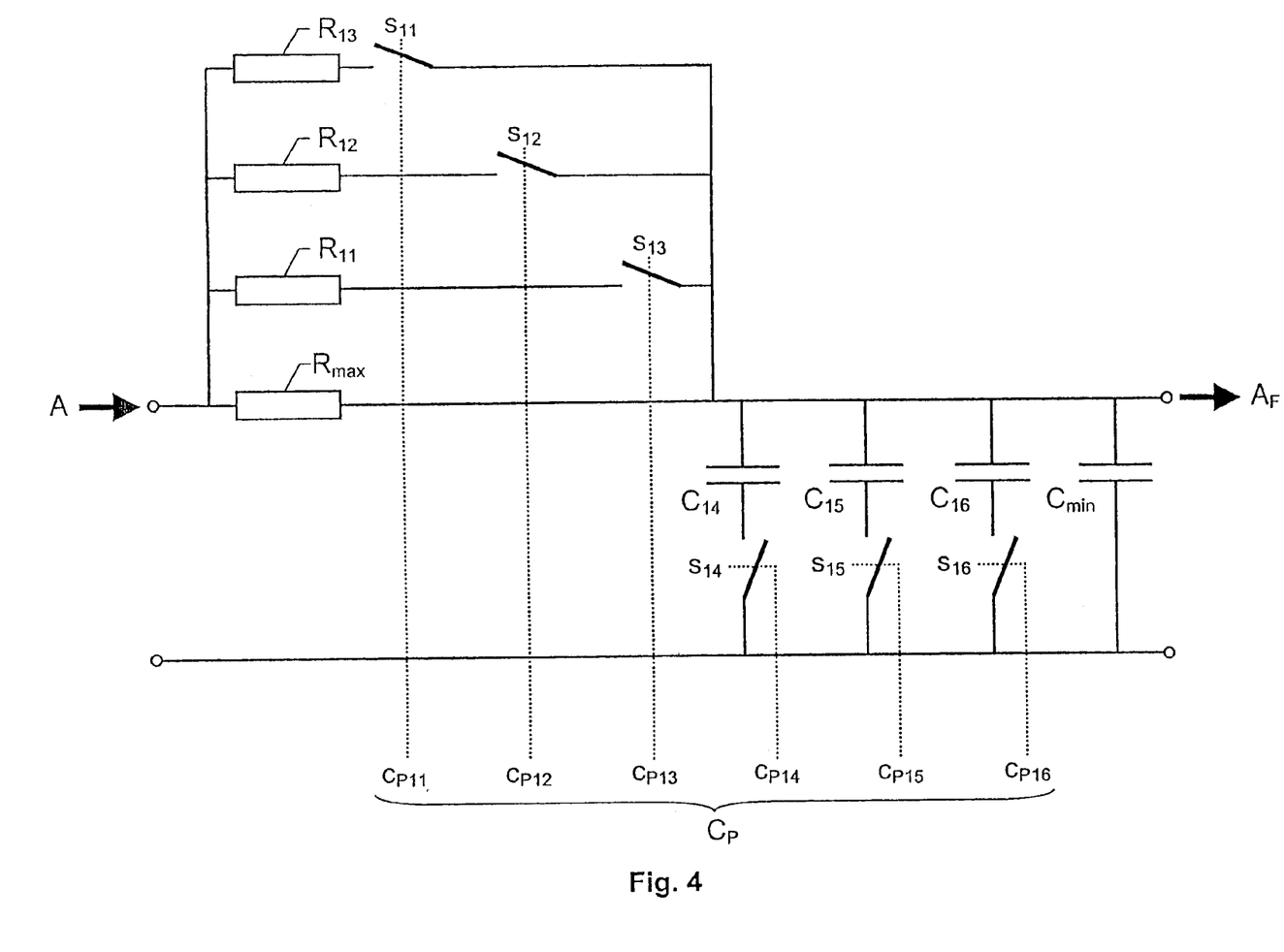
FIG. 4 shows a circuit diagram over analogue filter according to a second embodiment of the invention.

FIG. 4 shows a circuit diagram over an analogue filter according to a second embodiment of the invention, wherein both a resistance value and a capacitance value can be altered. In the illustrated example, the control signal $C_P$ has six signal elements $c_{P11}$–$c_{P16}$, of which the first three $c_{P11}$–$c_{P13}$ control a respective switch $s_{11}$ $s_{13}$ for a particular resistor-$R_{11}$–$R_{13}$. All the resistors $R_{11}$—$R_{13}$ are coupled in parallel with a fix resistor $R_{max}$, such that the total resistance value can be varied from $(R_{max}^{-1}+R_{11}^{-1}+R_{12}^{-1}+R_{13}^{-1})^{-1}$ to $R_{max}$. Correspondingly, the last three signal elements $c_{P14}$–$c_{P16}$ in the control signal $C_P$ control a respective switch $s_{14}$–$s_{16}$ for a particular capacitor $C_{14}$–$C_{16}$ being coupled in parallel with a fix capacitor $C_{min}$, such that the total capacitance value can be varied from $C_{min}$ to ($C_{min}+C_{14}+C_{15}+C_{16}$). Consequently, depending on the individual states of the signal elements $c_{P11}$–$c_{P16}$, the filter's RC-product can thus be varied in $2^6=64$ steps between $(R_{max}^{-1}+R_{11}^{-1}+R_{12}^{-1}+R_{12}^{-1})^{-1}C_{min}$ and $R_{max}$ $(C_{min}+C_{14}+C_{15}+C_{16})$.

The analogue filter according to this second embodiment of the invention can also be calibrated by means of the automatic adjusting circuit shown in FIG. 2. However, it is preferable that the adjustable phase shifter instead includes five resistors $R_{20}$, $R_{21}$, $R_{22}$, $R_{23}$, and $R_{max}$ having nominal values $R_{20}=0,5R_{11}$, $R_{21}=R_{11}$, $R_{22}=R_{12}$, $R_{23}=R_{13}$ and $R_{max}$ respectively and five capacitors $C_{24}$, $C_{25}$, $C_{26}$, $C_{27}$, and $C_{min}$ having nominal values $C_{24}=C_{14}$, $C_{25}=C_{15}$, $C_{26}=C_{16}$, $C_{27}=0$, $5C_{14}$ and $C_{min}$ respectively Analogously., the control signal $C_P$ should then preferably include eight signal elements $c_{P10}$–$c_{P17}$.

Figure 5:
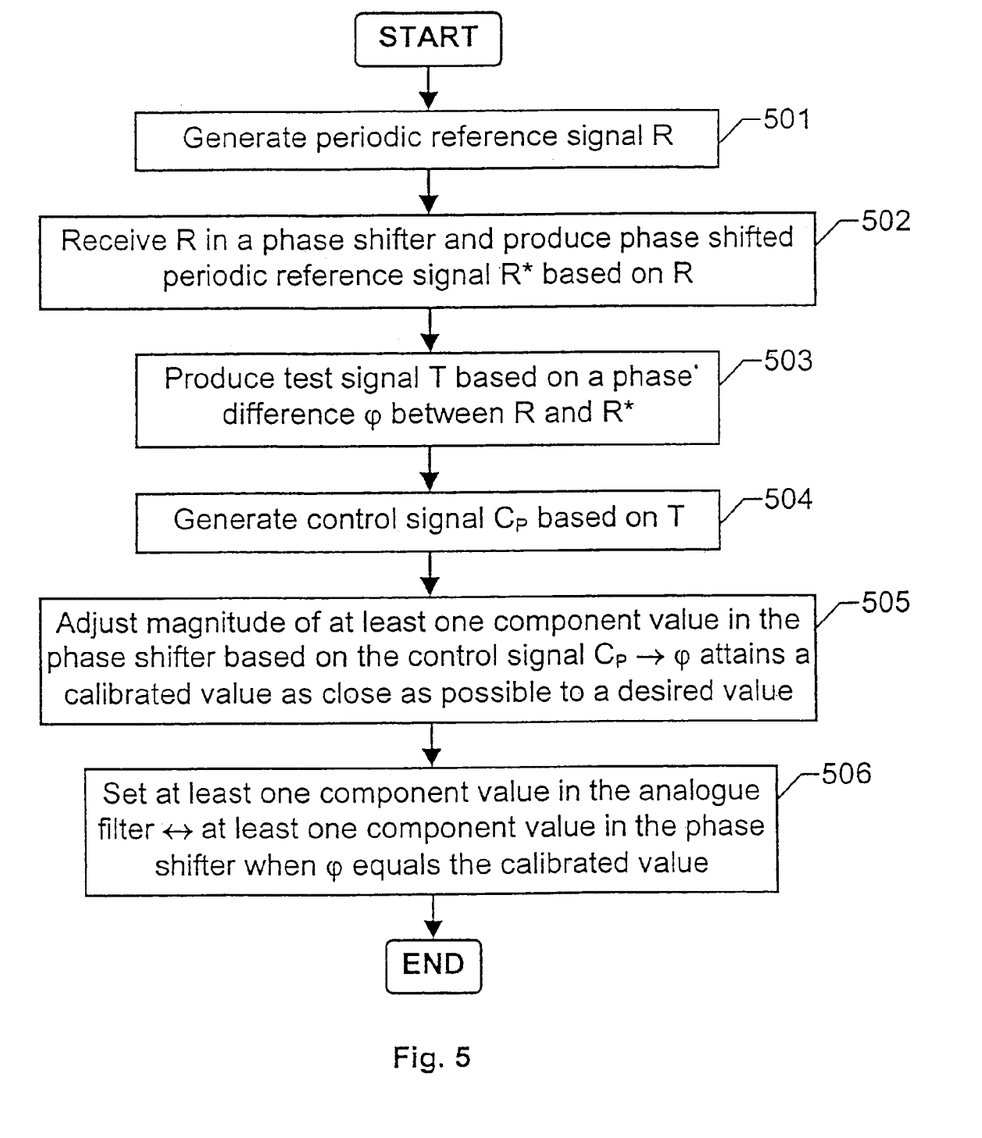
FIG. 5 illustrates, by means of a flow diagram, an embodiment of the method according to the invention.

In order to sum up, an embodiment of the proposed method for automatically altering a magnitude of at least one component value in an integrated analogue filter will now be described with reference to a flow diagram in the FIG. 5.

A first step 501, generates a periodic reference signal R, which is received in a second step 502. This step produces a phase shifted periodic reference signal R* on basis of the periodic reference signal R. A subsequent step 503, generates a test signal T from a phase difference φ between the periodic reference signal R* and the phase shifted periodic reference signal R*. A following step 504, delivers a control signal $C_P$ on basis of the test signal T. The control signal value $C_P$ depends on the test signal T according to what has been described above, and may e.g. be produced according to the procedure disclosed with reference to the FIGS. 1–3.

A step 505 then adjusts the magnitude of at least one component value in the adjustable phase shifter, such that the phase difference (p attains a calibrated value as close as possible to a desired value, for instance 90°. The at least one component value is varied systematically by means of the control signal $C_P$. After having found a control signal value $C_P$ that generates the calibrated value, a final step 506 sets at least one component value in an analogue filter in accordance with the associated control signal value $C_P$. This calibrates the analogue filter, such that its filtering characteristics-becomes as close as possible to the designed parameters, irrespective of any variations due the manufacturing process.

It should be noted that the steps 501–503 are performed continuously or at least periodically, and without direct control or involvement of a command unit (such as a digital signal processor). However, the steps 504–506 are executed at discrete moments in time and under direct control of a command unit.

All of the process steps, as well as any sub-sequence of steps, described with reference to the FIG. 5 above may be controlled by means of a computer program, for instance, a digital signal processor algorithm, being directly loadable into the-internal memory of a general computer, a digital signal processor, a baseband processor or an ASIC (Application Specific Integrated Circuit), which includes appropriate software for controlling the necessary steps when the program is run on a computer/digital signal processor. The computer program can likewise be recorded onto arbitrary kind of computer readable medium.

The term "comprises/comprising" when used in this specification is taken to specify the presence of stated features, integers, steps or components. However, the term does not preclude the presence or addition of one or more additional features, integers, steps or components or groups thereof.

The invention is not restricted to the described embodiments in the figures, but may be varied freely within the scope of the claims.

It should particularly be noted that the invention is not restricted to any specific relationships between the respective integrated component values. Thus, the invention is equally well applicable to any component value ratios different from those exemplified above.

What is claimed is:

1. An integrated circuit, comprising:
    an adjustable phase shifter operable to receive a reference signal and introduce a phase shift in the reference signal to produce a phase shifted reference signal;
    a phase detector operable to identify a phase difference between the reference signal and the phase shifted reference signal;
    a control signal generator operable to:
        generate a plurality of control signals, each of the control signals capable of causing the adjustable phase shifter to adjust a magnitude of at least one component value in the adjustable phase shifter, wherein the phase shift introduced by the adjustable phase shifter is based at least partially on the magnitude of the at least one component value in the adjustable phase shifter; and
        select one of the control signals, the selected control signal capable of causing the adjustable phase shifter to produce the phase shifted reference signal such that the phase difference attains a specified value; and
    an analog filter operable to adjust a magnitude of at least one component value in the analog filter based at least partially on the selected control signal.

2. The integrated circuit of claim 1, wherein the control signal generator comprises:
    an integrating element operable to receive signals representing identified phase differences from the phase detector and produce direct voltage components of the signals;
    one of:
        a comparator operable to compare the direct voltage components and a reference level and produce output signals based on the comparisons; and
        an analog-to-digital converter operable to digitize the direct voltage components; and
    a digital signal processor operable to select one of the plurality of control signals based at least partially on one of: the output signals and the digitized direct voltage components.

3. The integrated circuit of claim 1, wherein:
    the analog filter comprises one or more first switches and one or more first components; and
    the adjustable phase shifter comprises one or more second switches and one or more second components.

4. The integrated circuit of claim 3, wherein:
    the analog filter comprises more first components than first switches; and the adjustable phase shifter comprises more second components than second switches.

5. The integrated circuit of claim 4, wherein:
the first components in the analog filter comprise a plurality of first capacitors;
the second components in the adjustable phase shifter comprise a plurality of second capacitors;
each of the first capacitors is coupled in series to one of the first switches except the first capacitor having a first minimum capacitance; and
each of the second capacitors is coupled in series to one of the second switches except the second capacitor having a second minimum capacitance, the second minimum capacitance approximately equal to the first minimum capacitance.

6. The integrated circuit of claim 5, wherein:
each of the first capacitors has a capacitance that approximately equals a capacitance of one of the second capacitors; and
one of the second capacitors has a capacitance that is greater than the second minimum capacitance and that does not approximately equal any of the capacitances of the first capacitors.

7. The integrated circuit of claim 4, wherein:
the first components in the analog filter comprise a plurality of first resistors;
the second components in the adjustable phase shifter comprise a plurality of second resistors;
each of the first resistors is coupled in series to one of the first switches except the first resistor having a first maximum resistance; and
each of the second resistors is coupled in series to one of the second switches except the second resistor having a second maximum resistance, the second maximum resistance approximately equal to the first maximum resistance.

8. The integrated circuit of claim 1, further comprising:
a first latch operable to provide the plurality of control signals to the adjustable phase shifter; and
a second latch operable to provide the selected control signal to the analog filter;
wherein the control signal generator is further operable to generate command signals to open and close the first and second latches.

9. A method, comprising:
receiving information identifying a phase difference between a reference signal and a phase shifted reference signal, the phase shifted reference signal produced by an adjustable phase shifter introducing a phase shift in the reference signal;
generating a plurality of control signals, each of the control signals capable of causing the adjustable phase shifter to adjust a magnitude of at least one component value in the adjustable phase shifter, wherein the phase shift introduced by the adjustable phase shifter is based at least partially on the magnitude of the at least one component value in the adjustable phase shifter;
selecting one of the control signals, the selected control signal capable of causing the adjustable phase shifter to produce the phase shifted reference signal such that the phase difference attains a specified value; and
providing the selected control signal to an analog filter, the selected control signal capable of causing the analog filter to adjust a magnitude of at least one component value in the analog filter.

10. The method of claim 9, wherein receiving information identifying the phase difference and selecting one of the control signals comprise:
receiving signals representing the identified phase differences;
producing direct voltage components of the signals;
one of:
comparing the direct voltage components and a reference level to produce output signals based on the comparisons; and
digitizing the direct voltage components; and
selecting one of the plurality of control signals based at least partially on one of: the output signals and the digitized direct voltage components.

11. The method of claim 9, wherein:
the analog filter comprises one or more first switches and one or more first components;
the adjustable phase shifter comprises one or more second switches and one or more second components; and
the control signals are capable of causing at least some of the first and second switches to open and close.

12. The method of claim 11, wherein:
the analog filter comprises more first components than first switches;
the adjustable phase shifter comprises mare second components than second switches.

13. The method of claim 12, wherein:
the first components in the analog filter comprise a plurality of first capacitors;
the second components in the adjustable phase shifter comprise a plurality of second capacitors;
each of the first capacitors is coupled in series to one of the first switches except the first capacitor having a first minimum capacitance; and
each of the second capacitors is coupled in series to one of the second switches except the second capacitor having a second minimum capacitance, the second minimum capacitance approximately equal to the first minimum capacitance.

14. The method of claim 13, wherein:
each of the first capacitors has a capacitance that approximately equals a capacitance of one of the second capacitors; and
one of the second capacitors has a capacitance that is greater than the second minimum capacitance and that does not approximately equal any of the capacitances of the first capacitors.

15. The method of claim 12, wherein:
the first components in the analog filter comprise a plurality of first resistors;
the second components in the adjustable phase shifter comprise a plurality of second resistors;
each of the first resistors is coupled in series to one of the first switches except the first resistor having a first maximum resistance; and
each of the second resistors is coupled in series to one of the second switches except the second resistor having a second maximum resistance, the second maximum resistance approximately equal to the first maximum resistance.

16. The method of claim 9, further comprising:
generating command signals to open and close first and second latches, the first latch operable to provide the plurality of control signals to the adjustable phase shifter, the second latch operable to provide the selected control signal to the analog filter.

17. A computer program embodied one computer readable medium and operable to be executed, the computer program comprising computer readable program code for:
- receiving information associated with a phase difference between a reference signal and a phase shifted reference signal generated by an adjustable phase shifter;
- generating a plurality of control signals, each of the control signals capable of causing the adjustable phase shifter to adjust a magnitude of at least one component value in the adjustable phase shifter, wherein a phase shift introduced by the adjustable phase shifter is based at least partially on the magnitude of the at least one component value in the adjustable phase shifter;
- selecting one of the control signals, the selected control signal capable of causing the adjustable phase shifter to produce the phase shifted reference signal such that the phase difference attains a specified value; and
- providing the selected control signal to an analog filter, the selected control signal capable of causing the analog filter to adjust a magnitude of at least one component value in the analog filter.

18. The computer program of claim 17, further comprising computer readable program code for:
- generating command signals to open and close first and second latches, the first latch operable to provide the plurality of control signals to the adjustable phase shifter, the second latch operable to provide the selected control signal to the analog filter.

19. The computer program of claim 17, wherein
- the analog filter comprises a plurality of first switches and a plurality of first capacitors;
- the adjustable phase shifter comprises a plurality of second switches and a plurality of second capacitors;
- each of the first capacitors is coupled in series to one of the first switches except the first capacitor having a first minimum capacitance;
- each of the second capacitors is coupled in series to one of the second switches except the second capacitor having a second minimum capacitance, the second minimum capacitance approximately equal to the first minimum capacitance; and
- the control signals are capable of causing at least some of the first and second switches to open and close.

20. The computer program of claim 17, wherein:
- the analog filter comprises a plurality of first switches and a plurality of first resistors;
- the adjustable phase shifter comprises a plurality of second switches and a plurality of second resistors;
- each of the first resistors is coupled in series to one of the first switches except the first resistor having a first maximum resistance;
- each of the second resistors is coupled in series to one of the second switches except the second resistor having a second maximum resistance, the second maximum resistance approximately equal to the first maximum resistance; and
- the control signals are capable of causing at least some of the first and second switches to open and close.

* * * * *

UNITED STATES PATENT AND TRADEMARK OFFICE
CERTIFICATE OF CORRECTION

PATENT NO. : 7,002,427 B2 Page 1 of 1
APPLICATION NO. : 10/769976
DATED : February 21, 2006
INVENTOR(S) : Christian Nystrom, Per Konradsson and Ari Grasbeck It is certified that error appears in the above-identified patent and that said Letters Patent is hereby corrected as shown below:

Column 1, line 11, insert -- , -- after the term "particularly";

Column 2, line 4, delete "4" after the term "filter";

Column 5, line 3, delete "." After the term "signal";

Column 7, line 3, delete "-" after the term "resistor";

Column 7, line 24, insert -- . -- after the term "respectively";

Column 7, line 24, delete "." After the term "Analogously";

Column 7, line 35, delete "Φ" and replace with -- φ --;

Column 7, line 44, delete "(p" and replace with -- φ --;

Column 7, line 52, delete "-" before the term "becomes";

Column 10, claim 12, line 25, delete "mare" and replace with -- more --.

Signed and Sealed this

Fifth Day of December, 2006

JON W. DUDAS
*Director of the United States Patent and Trademark Office*